United States Patent [19]
Kohketsu et al.

[11] Patent Number: 5,307,319
[45] Date of Patent: Apr. 26, 1994

[54] INITIALIZATION SETTING CIRCUIT AND SEMICONDUCTOR MEMORY DEVICE USING THE SAME

[75] Inventors: Takashi Kohketsu; Teruo Seki, both of Kasugai, Japan

[73] Assignee: Fujitsu Limited, Japan

[21] Appl. No.: 844,659

[22] PCT Filed: Aug. 28, 1991

[86] PCT No.: PCT/JP91/01143
§ 371 Date: Apr. 2, 1992
§ 102(e) Date: Apr. 2, 1992

[87] PCT Pub. No.: WO92/03825
PCT Pub. Date: Mar. 5, 1992

[30] Foreign Application Priority Data
Aug. 28, 1990 [JP] Japan .................. 2-227215

[51] Int. Cl.⁵ .............................. G11C 13/00
[52] U.S. Cl. .................... 365/230.08; 365/189.01; 365/189.05
[58] Field of Search ........ 365/189.01, 230.01, 365/203, 189.05, 230.08

[56] References Cited
U.S. PATENT DOCUMENTS
4,001,609 1/1977 Sickert .
5,124,951 6/1992 Slemmer .................. 365/230.08

FOREIGN PATENT DOCUMENTS
0155113 9/1985 European Pat. Off. .
63-314914 12/1988 Japan .

Primary Examiner—Terrell W. Fears
Attorney, Agent, or Firm—Welsh & Katz, Ltd.

[57] ABSTRACT

An initialization setting circuit (20) is adapted to set an initial condition of a latch circuit in a semiconductor device upon ON-set of the power supply, comprises a detecting circuit (TR1, TR2, R, 21) responsive to ON-set of power supply to detect the power source voltage (Vcc) reaching a given voltage, and an output level control circuit (22) responsive to the detecting signal output from the detecting circuit, for elevating up the level of an output signal of the initialization setting circuit to a high potential level or lowering the level of the output signal of the initialization setting circuit to a low potential level. By supplying the output signal controlled by said output level control circuit of the latch circuit as the power source voltage; the operation of the latch circuit is synchronized when the power source voltage is shut down, and a malfunction can be successfully prevented upon resetting of the power supply.

11 Claims, 8 Drawing Sheets

INITIALIZATION SETTING CIRCUIT AND SEMICONDUCTOR MEMORY DEVICE USING THE SAME

FIELD OF THE INVENTION

The present invention relates to a circuit for setting an initial condition of a latch circuit for holding operational conditions of respective circuits in a semiconductor device upon ON-set of power supply, and more particularly, to an improvement for an initialization setting circuit for setting initial conditions of a latch circuit that holds information, such as addresses, control signals, data and so forth in a semiconductor memory device, upon ON-set of power supply.

A latch circuit is provided in a semiconductor memory device, for example, for latching operational conditions of respective circuit. An initialization setting circuit is typically connected to the latch circuit for setting initial condition upon ON-set of the power supply.

BACKGROUND ART

Figure 1:
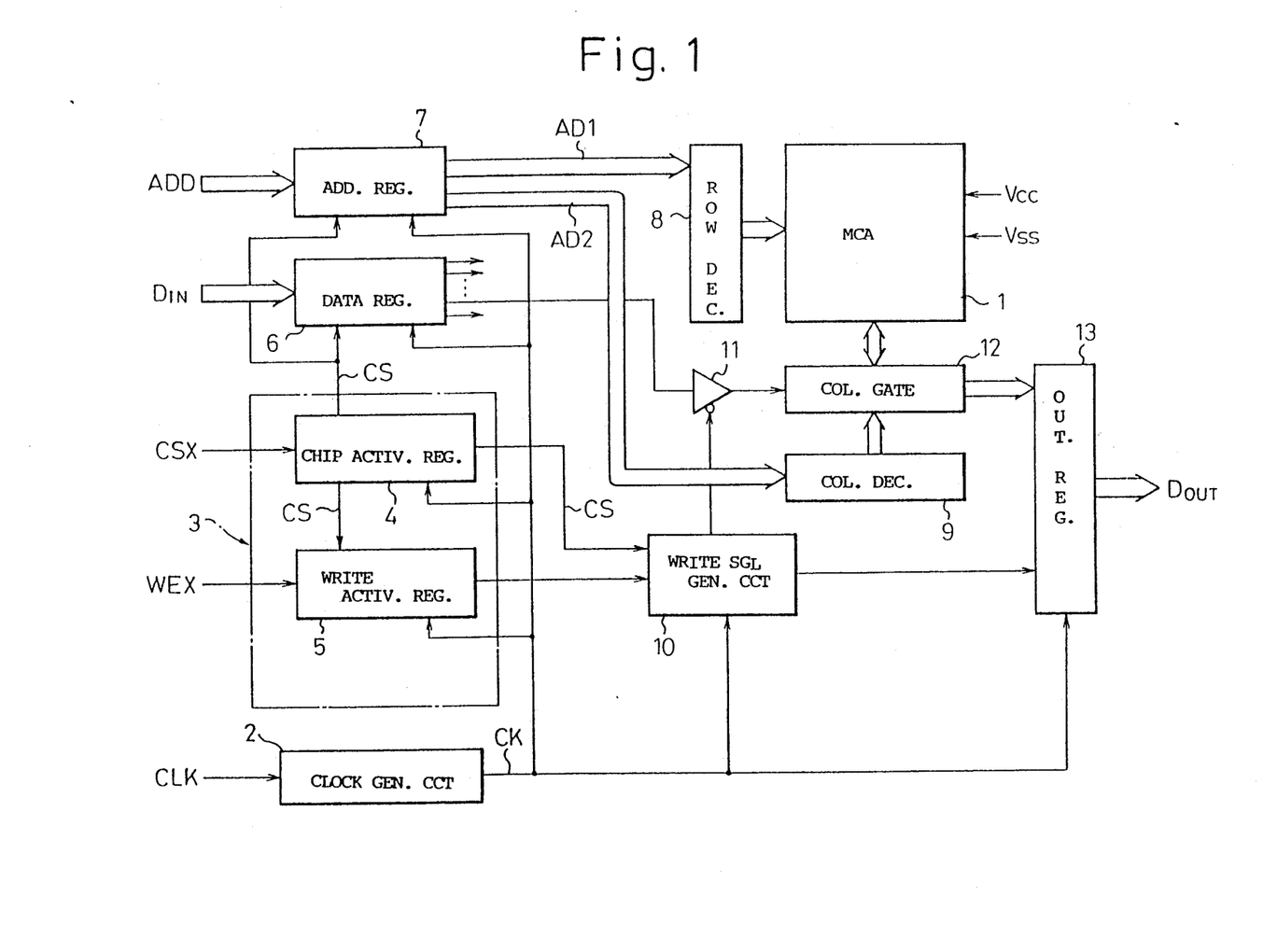
FIG. 1 is a block diagram showing construction of a semiconductor memory device according to the present invention.

In the conventional semiconductor memory device, as in the construction shown in FIG. 1, for example, an external address signal Add is input to a row decoder 8 and a column decoder 9 as respective row address signal AD1 and column address signal AD2, through an address register 7. Respective decoders produce decode signals based on respective address signals to select a memory cell of the corresponding address in a memory cell array 1, and writing and reading of data is performed.

In this case, the address register 7 receives an activation signal CS from a chip activation register 4 to control the transmission of the address signal ADD for the internal circuit. The activation signal CS is generated, when reference is made to the construction in FIG. 3, by a chip activation register on the basis of a chip selection signal CSX of an active row, the chip selection signal of which is supplied externally. In this case, the chip selection signal CSX is input to a latch circuit 30 formed by two inverters 34 and 35 connected in a reverse parallel relationship, through two stage inverters 31 and 32 and a transfer gate 33, and is further output as the activation signal CS through two stage inverters 36 and 37. In this construction, when the chip selection signal CSX is "H" level, an "H" level signal is input to the latch circuit 30 and a "L" level signal is output from the latch circuit 30. Therefore, the activation circuit CS becomes "L" level to maintain the address register 7 in an inactive state. Conversely, when the chip selection signal CSX is "L" level, since a "H" level signal is output from the latch circuit 30, the activation signal CS becomes "H" level to activate the address register 7.

On the other hand, for one of the inverter 34 of the latch circuit, a power source voltage Vout is supplied from an initialization setting circuit 20a which will be discussed later (see FIG. 3). For the other inverter 35, power source voltage Vcc is directly supplied from a high potential power source line (not shown) similarly to other circuits. Upon ON set of power (Vcc) supply for such semiconductor memory device, by an operation of the initialization setting circuit 20a, the power source voltage Vout is supplied to the inverter 34 with a delay from the supply of the power source voltage Vcc for the inverter 35. Therefore, upon ON-set of the power supply, because of the operation of the inverter 35 in advance of initiation of the operation of the inverter 34 in the latch circuit 30, the potential at the input terminal A of the latch circuit 30 becomes "H" level, and by this operation of the inverter 35, the output signal of the latch circuit 30 is latched at "H" level after the power supply for the inverter 34.

Figure 2:
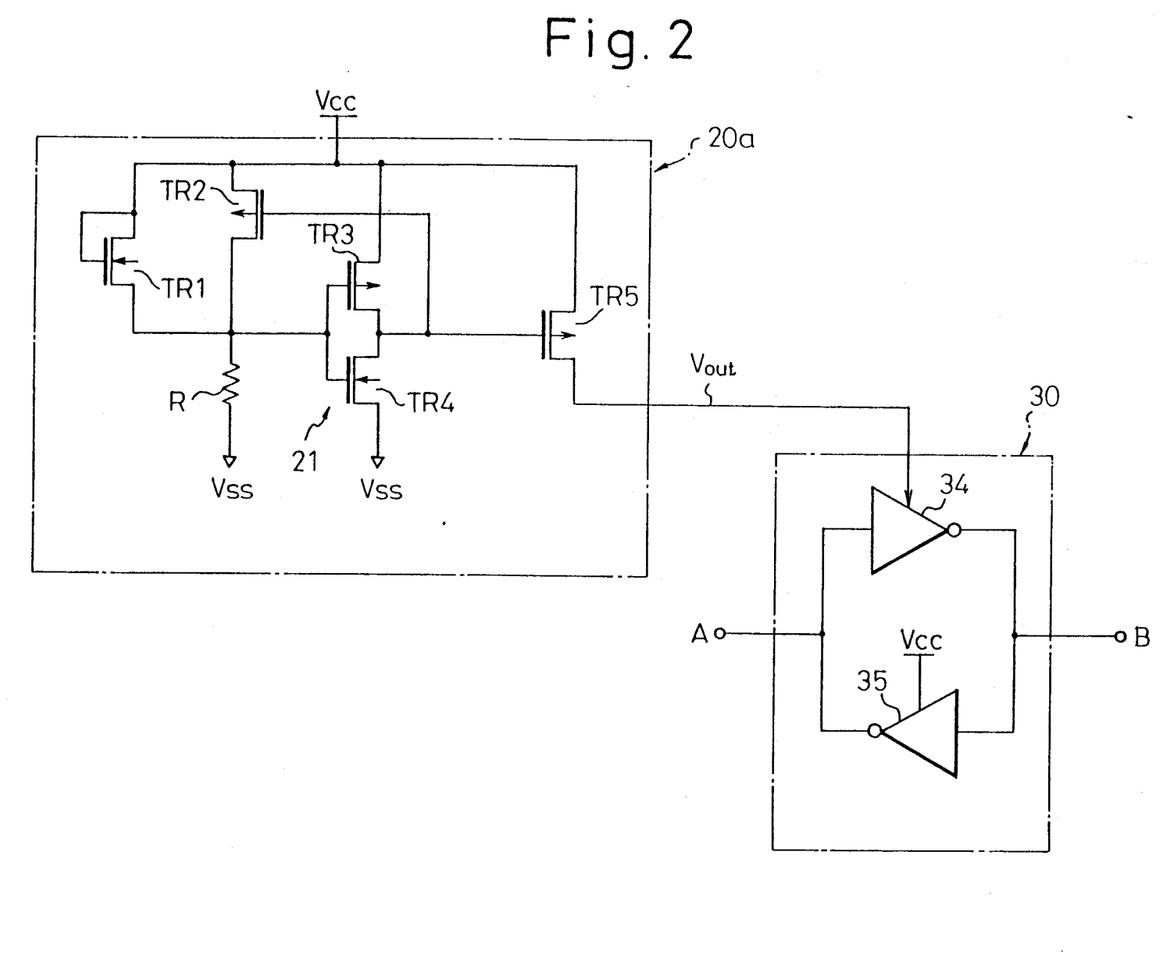
FIG. 2 is a circuit diagram showing one example of the conventional initialization setting circuit.

FIG. 2 shows one example of construction of the above-mentioned initialization setting circuit 20a.

In this figure, for the input terminal of a CMOS inventer 21 (p channel transistor TR3 and n channel transistor TR4), the source of an n channel transistor TR1 is connected. The drain and the gate of the n channel transistor TR1 are connected to a high potential power source line Vcc. On the other hand, to the input terminal of the inverter 21, the drain of a p channel transistor TR2 is connected, which has the source connected to the power source line Vcc, and the gate connected to the output terminal of the inverter 21. Further, a resistor R is disposed between the input terminal of the inverter 21 and a low potential power source line Vss. On the other hand, the output terminal of the inverter 21 is output to the gas of a p channel transistor TR5, the transistor of which has the source connected to the power source line Vcc, and the drain connected to the output terminal (output voltage Vout) of the initialization setting circuit 20a.

When the power source Vcc is allied to the initialization circuit 20a constructed as set forth above, a voltage lower than the power source voltage Vcc by a magnitude corresponding to the threshold level (VthN) of the transistor TR1, is applied to the input terminal of the inverter 21. Subsequently, after a given period from the rise of the power source voltage Vcc, the inverter 21 makes a decision for "H" level for the level of (Vcc−VthN) to output a "L" level output signal to the transistor TR5. By this, the transistor TR5 is turned ON to output the output signal Vout equal to the power source voltage Vcc at the output terminal. On the other hand, at the same time, the transistor TR2 is turned ON to maintain the level at the input terminal of the inverter 21 at "H" level.

Accordingly, the initialization setting circuit 20a is responsive to ON-set of the power supply voltage Vcc and outputs the output signal Vout more rapidly than the power source voltage Vcc at the output terminal with a given period of delay from ON-set. Through the operation set forth above, the power supply for the inverter 34 of the latch circuit 30 is slightly delayed.

However, in the initialization setting circuit 20a as set forth above, a problem will be arise when power source voltage Vcc is shut down at the condition in which the voltage Vout is supplied to the inverter 34 of the latch circuit 30 from the output terminal by ON-set of the power supply (namely, the condition that the signal line connected to the drain of the transistor TR5 is charged at a level substantially corresponding to the power source voltage Vcc).

Namely, the charge accumulated at the output terminal cannot be discharged, and as a result, the voltage level (level of the output signal Vout) at the output terminal is floating at an intermediate level. Accordingly, if power source voltage Vcc is again applied to respective circuits, due the level of the output signal Vout (intermediate level) of the initialization setting circuit 20a, the inverters 34 and 35 of the latch circuit 30 start operation simultaneously. As a result, it becomes possible that the potential at the output terminal B of the latch circuit 30 becomes "H" level. Therefore, the problem of malfunction can arise upon writing in and reading out data.

SUMMARY OF THE INVENTION

Accordingly, it is an object of the present invention to provide an initialization setting circuit that assures initialization of the operation again upon setting the power supply ON when the power source voltage is shut down, and thus can prevent malfunction.

In order to accomplish the above-mentioned object, there is provided an initialization setting circuit according to the present invention that is adapted to set an initial condition of a latch circuit in a semiconductor device upon ON-set of the power supply, comprising a detecting circuit responsive to ON-set of the power supply to detect the power source voltage reaching a given voltage, and an output level control circuit responsive to the detecting signal output from the detecting circuit, for elevating the level of an output signal of the initialization setting circuit to a high potential level or pulling down the level of the output signal of the initialization setting circuit to a low potential level, the output signal controlled by said output level control circuit being supplied to the latch circuit as the power source voltage.

With the construction set forth above, the output level control circuit can pull-up the output signal level of the initialization setting circuit rapidly to a high potential level with a delay from a rising of the power source voltage, upon ON-set of the power source voltage. Also, upon shutting of the power source voltage, the output signal level of the initialization setting circuit can be rapidly pulled down to the low potential level. Accordingly, when the power source voltage is shut down, the operation of the latch circuit can be certainly initialized and thus make it possible to prevent malfunction of the ON setting power supply.

It should be noted that other features and functions of the present invention will be discussed herebelow in detail with reference to the accompanying drawings.

BEST MODE FOR IMPLEMENTING THE INVENTION

Hereafter, the practical embodiments of the present invention will be discussed with reference to FIGS. 1 and 3 to 8.

FIG. 1 shows the construction of one embodiment of a semiconductor memory device according to the present invention.

The shown device is a so-called self-timed random-access-memory (self-timed RAM) adapted to perform a necessary memory operation with internal synchronization by clock with respect to externally entered asynchronous data, address signal and various control signals.

In this figure, the reference numeral 1 denotes a memory cell array, 2 denotes a clock generator circuit for generating synchronization clock signal CK for internal use on the basis of an external clock signal CLK, 3 denotes a control register. The control register includes a chip activation register 4 that receives an externally entered chip selection signal CSX of the active row in response to the clock signal to generate an activation signal CS and a write activation register 5 that receives an externally entered write enabling signal WEX of active row in response to the clock signal and is controlled by the activation signal CS. The reference numeral 6 denotes a data register that receives externally entered data DIN in response to the clock signal and is controlled by the activation signal CS, 7 denotes an address register that receives an externally entered address signal ADD in response to the clock signal and is controlled by the activation signal CS.

On the other hand, the reference numeral 8 denotes a row decoder that decodes row address signal AD1 output from the address register and selects one of word lines (not shown) in a memory cell array 1, 9 denotes a column decoder that decodes column address signal AD2 output from the address register 7 and selects one of bit lines in the memory cell array 1, 10 denotes a write-in signal generating circuit for generating a write-in signal based on the activation signal CS from the register 4 and the write enabling signal from the register, in response to the clock signal CK, 11 denotes a try state buffer for controlling passing and blocking output of the data register 6 depending upon the logical level of the write-in signal, 12 denotes a column gate connecting the selected column line to a data line (output line of the try state buffer and input line of an output register 13), 13 denotes the output register for externally outputting the data output through the column gate 12 as an output (D00T) in response to the write-in signal and the clock signal CK.

Figure 3:
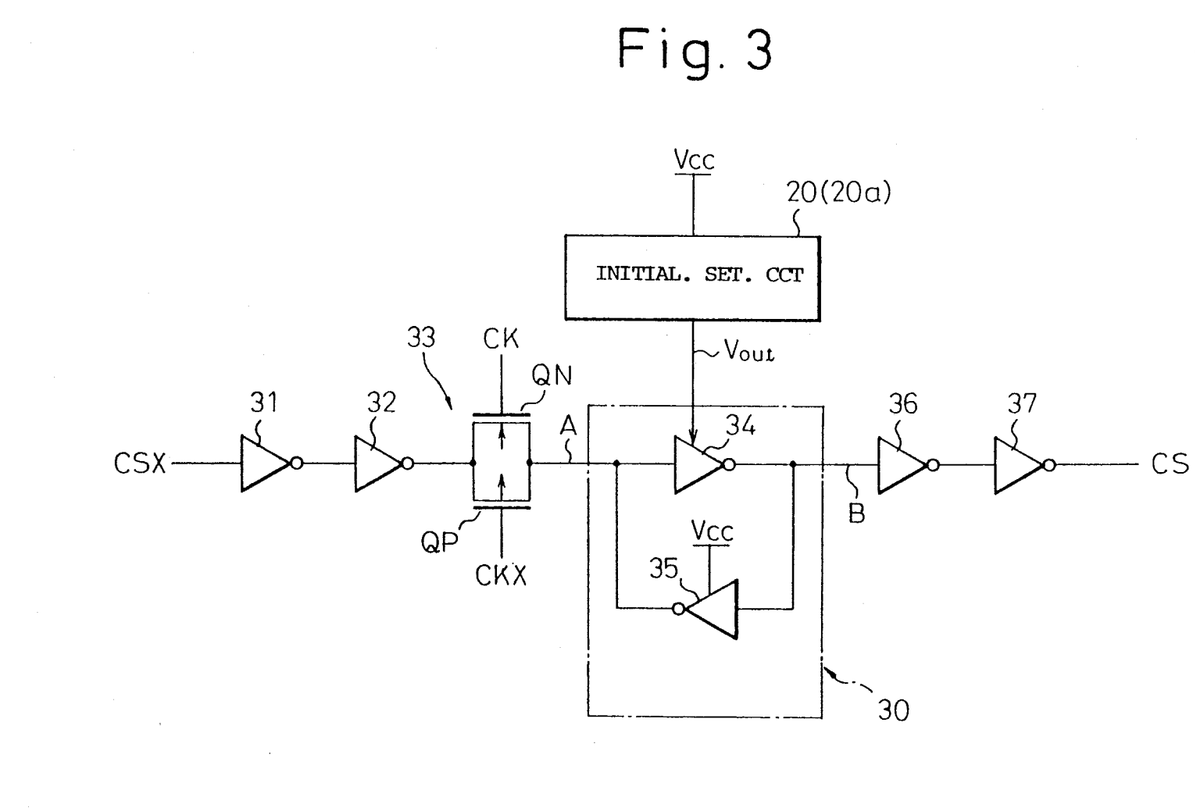
FIG. 3 is a circuit diagram showing construction of a chip activation register in FIG. 1.

FIG. 3 shows a circuit construction of the check activation register 4.

The shown circuit includes an inverter 31 responsive to the externally entered chip selection signal CSX, an inverter 32 responsive to the output of the inverter, a transfer gate 33 that comprises an n channel transistor QN and a p channel transistor QP and controls transmission and blocking of the output of the inverter 32 in response to the clock signal CK or an inverted signal thereof, a latch circuit 30 composed of two inverters 34 and 35 arranged in reverse parallel connection, an initialization setting circuit 20 for supplying a power source voltage Vout for the inverter 34 in the latch circuit, an inverter 36 responsive to the output of the latch circuit 30, and an inverter 37 generating the activation signal CS in response to the output of the inventer.

Figure 4:
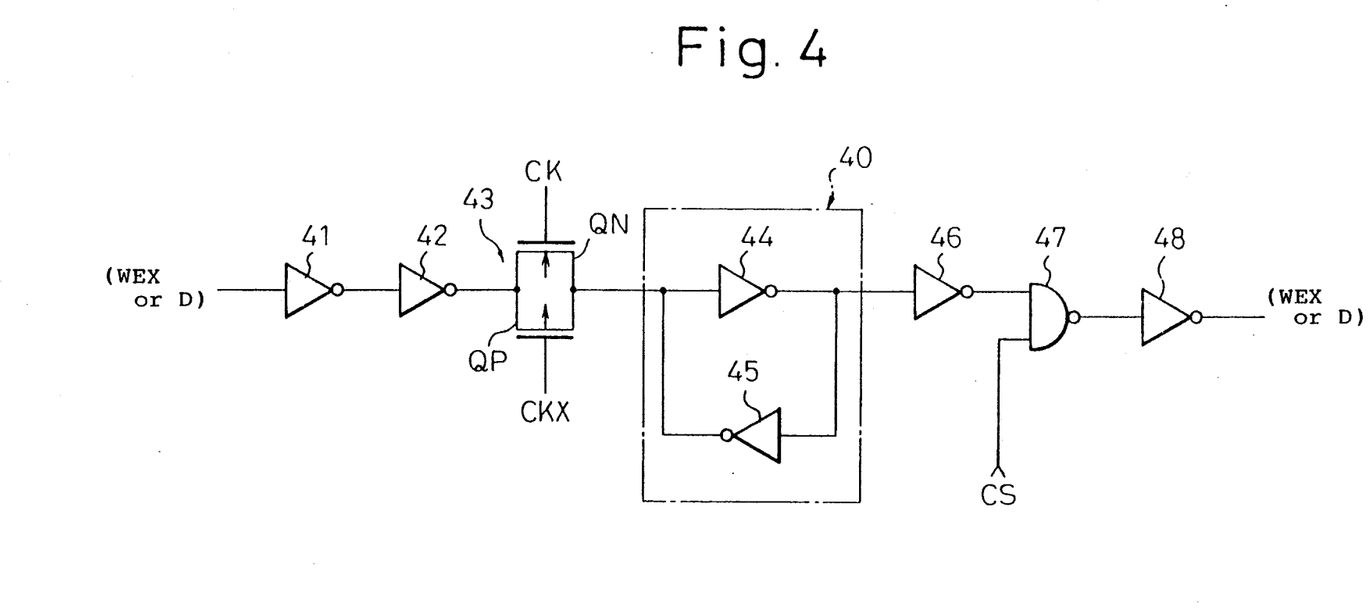
FIG. 4 is a circuit diagram showing the construction of a writing activation register or data register in FIG. 1, which illustrates a part for one bit.

FIG. 4 shows the circuit construction of the write-in activation register 5 (or data register 6 in a part for one bit).

The shown circuit includes an inverter 41 responsive to an external write enabling signal WEX (or data D), an inverter 42 responsive to the output of the inverter, a transfer gate comprising an n channel transistor QN and a p channel transistor QP in parallel connection to each other and controlling the transmission and blocking of output of the inverter 42 in response to the clock signal CK or the inverted signal CKX thereof, a latch circuit 40 comprising two inverters 44 and 45 in reverse parallel connection, an inverter 46 responsive to the output of the latch circuit, a NAND gate 47 responsive to the output of the inverter and the activation signal CS, and an inverter 48 outputting the write enabling signal WEX (or data D) in response to the output of the NAND gate.

Figure 5:
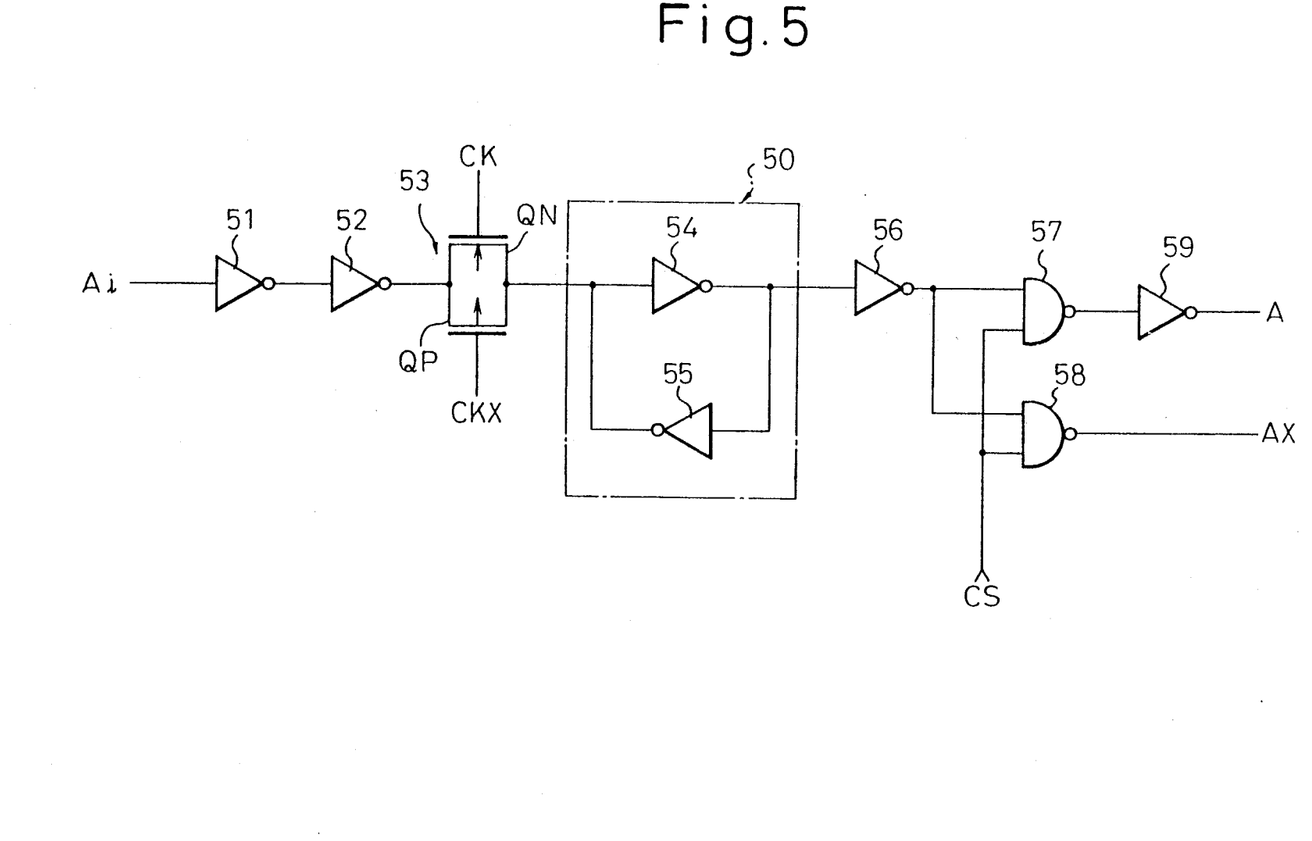
FIG. 5 is a circuit diagram showing the construction of an address register of FIG. 1, which illustrates a part for one bit.

FIG. 5 shows a circuit construction of an address register 7 for one bit.

The shown circuit includes an inverter 51, an inverter 52 responsive to the output of the inverter, a transfer gate comprising an n channel transistor QN and a p channel transistor QP in parallel connection to each other and controlling transmission and blocking of output of the inverter 52 in response to the clock signal CK or the inverted signal CKX thereof, a latch circuit 40 comprising two inverters 4 and 55 of reverse parallel connection, an inverter 6 responsive to the output of the latch circuit, a NAND gate responsive to the output of the inverter and the activation signal CS, a NAND gate responsive to the output of the inverter 56 and the activation signal CS to output an inverted address bit AX, an inverter 59 responsive to the output of the NAND gate 7 for outputting an address bit A.

Figure 6:
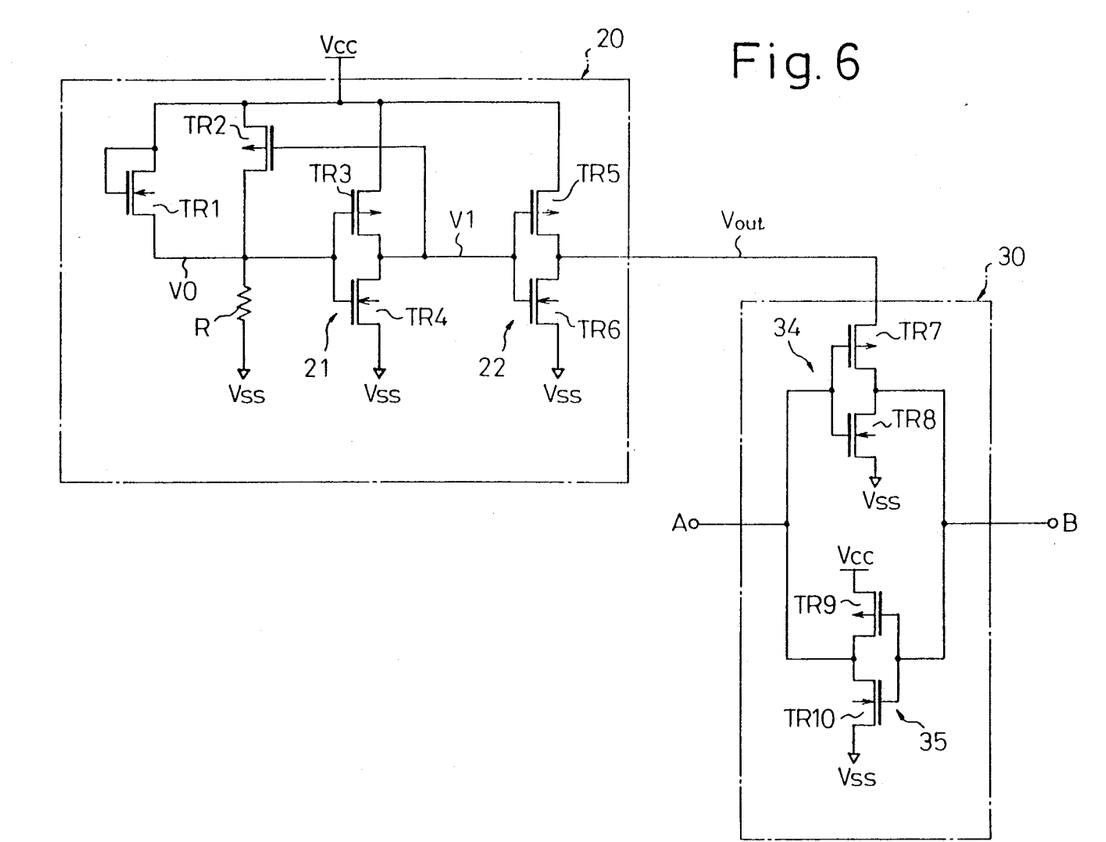
FIG. 6 is a circuit diagram showing the construction of one embodiment of the initialization setting circuit according to the present invention.

FIG. 6 shows the circuit construction of the initialization setting circuit (see FIG. 3), which is a particular feature of the present invention.

As shown in this figure, the shown embodiment of the initialization setting circuit 20 is constructed by connecting an n channel transistor TR6 that is connected between the drain of the transistor TR5 and a power source line Vss and responsive to the output signal V1 of the inverter 21, to the p channel transistor TR5 of the conventional initialization setting circuit 20a (see FIG. 2) so as to form CMOS inventer 22, and supplies the output Vout of this inverter 22 to one of the inverters 34 of the latch circuit 30 as the power source voltage.

With this construction, by utilizing the n channel transistor TR1 as an enhancement type, the bias effect of the substrate is utilized. In the shown embodiment, the threshold level (approximately 1.5 to 2V) of the transistor is set to be higher than the threshold level (approximately 1V or more or less) of the p channel transistor TR3. On the other hand, for the resistor R, a substantially higher resistance value of several MΩ is provided.

Figure 7:
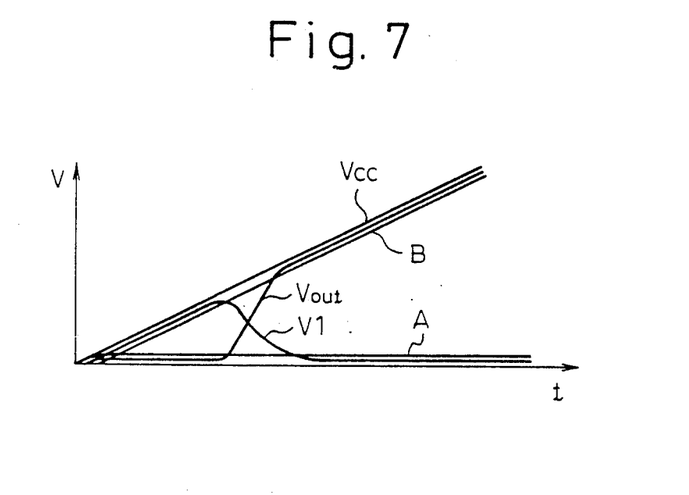
FIG. 7 is a chart showing a signal waveform illustrating operation of the circuit of FIG. 6 upon ON-set of the power supply.

In FIG. 7, there is illustrated signal waveforms at various portions in the initialization setting circuit 20 of FIG. 6, upon ON-set of the power supply.

Consideration is given to the fact that the output terminal of the shown embodiment of the initialization setting circuit (output signal Vout) is connected to one of the inverters 34 of the latch circuit 30 similarly to the prior art, and the power source voltage Vcc is applied to the initialization setting circuit 20 and the latch circuit 30.

When the power source voltage Vcc exceeds a predetermined level, the gate potential (voltage V0) of the n channel transistor TR4 of the inverter 21 via the transistor TR1 becomes higher than or equal to the threshold level to turn the transistor TR4 ON and thus turns the output signal V1 of the inverter into a "L" level signal. Subsequently, by this output signal V1, the p channel transistor TR5 of the inverter 22 is turned ON so that the output signal Vout of the inverter 22 is rapidly elevated to the level of the power source voltage Vcc. The output signal Vout is supplied to the inverter 34 of the latch circuit 30 as the power source voltage.

On the other hand, at the latch circuit, associated with ON-set of the power source voltage Vcc, the inverter 35 initiates an operation to elevate the level at the input terminal A of the latch circuit 30 to "H" level, i.e. the power source voltage Vcc, and latched at this condition. Accordingly, upon ON-set of the power supply, it operates in the same manner as the prior art.

Figure 8:
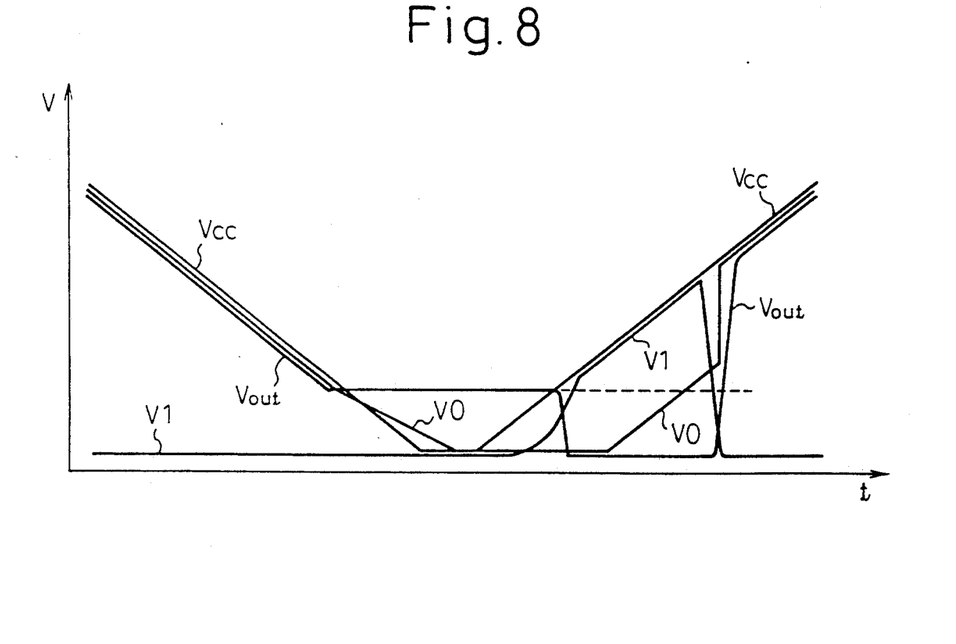
FIG. 8 is a chart showing signal waveform illustrating the operation of the circuit of FIG. 6 upon setting the On power supply after shutting down the power supply.

FIG. 8 shows the signal waveform at various portions of the initialization setting circuit of FIG. 1, upon shutting down of the power source and subsequent ON-set again.

When the power source voltage Vcc for the initialization setting circuit 20 and the latch circuit 30 is shut down, the source potential (voltage V0) of the transistor TR1 and the potential of the output signal Vout lowers gradually according to the lowering of the power source voltage Vcc. When the power source voltage Vcc is lowered to a given level (the threshold level of the p channel transistor TR5 of the inventer 22), the output signal Vout maintains the instantaneous level thereafter. On the other hand, with respect to the input voltage (voltage V0) of the inverter 21, according to a voltage drop at the resistor, the potential is lowered gradually.

When the power supply is resumed after lowering the power source voltage Vcc across the above-mentioned given level, since the threshold level of the transistor TR3 is lower than the threshold level of the transistor TR1, the transistor TR3 is turned ON earlier. By this, the output signal V1 of the inverter 21 rises to the level of the power source voltage Vcc. By this, the n channel transistor TR6 of the inverter 22 is turned ON to lower the output signal Vout to "L" level.

At this time, as shown by a broken line in this figure, the output signal Vout in the prior art is floating at the intermediate level instead of being lowered to the "L" level. However, with the construction of this embodiment, the charge accumulated at the output terminal (output signal Vout) is drawn to the power source line Vss by turning ON the n-channel transistor TR6 of the inverter 22, and therefore, the output signal Vout attains "L" level.

As set forth, in the construction of the shown embodiment of the initialization setting circuit 20, by a power supply for the inverter 34 of the latch circuit, the ON-set of the power supply is delayed, the initial output signal of the latch circuit becomes a "L" level signal, and upon shutting down of the power supply, the output signal Vout is lowered to the "L" level by the operation of the inverter 22 (n channel transistor TR6) to prevent outputting of erroneous signals from the latch circuit 30 and so forth, upon re-setting of the power supply.

It should be noted that in the shown embodiment, upon ON-set of the power source voltage Vcc after once shutting down, the level of the output signal Vout is lowered to "L" level. This is for the following reason.

Namely, the timing to lower the output signal level to "L" level by turning ON the n channel transistor TR6 of the inventer appears to be able to shut down the power supply. However, in view of the capacity of the output signal (Vout) line, it is necessary to add an element, such as a resistor for drawing the charge on the line, and the value of the additional element has to be varied according to the condition of the circuit. The adjustment should become cumbersome.

However, according to the shown embodiment, the desired task can be achieved solely by adding the n channel transistor TR6.

On the other hand, although the initialization setting circuit 20 is provided only for the latch circuit 30 in the chip activation register 4 in the foregoing embodiment, such initialization setting circuit can also be applied for the write-in activation register 5, the data register 6 or the address register 7.

Figure 9:
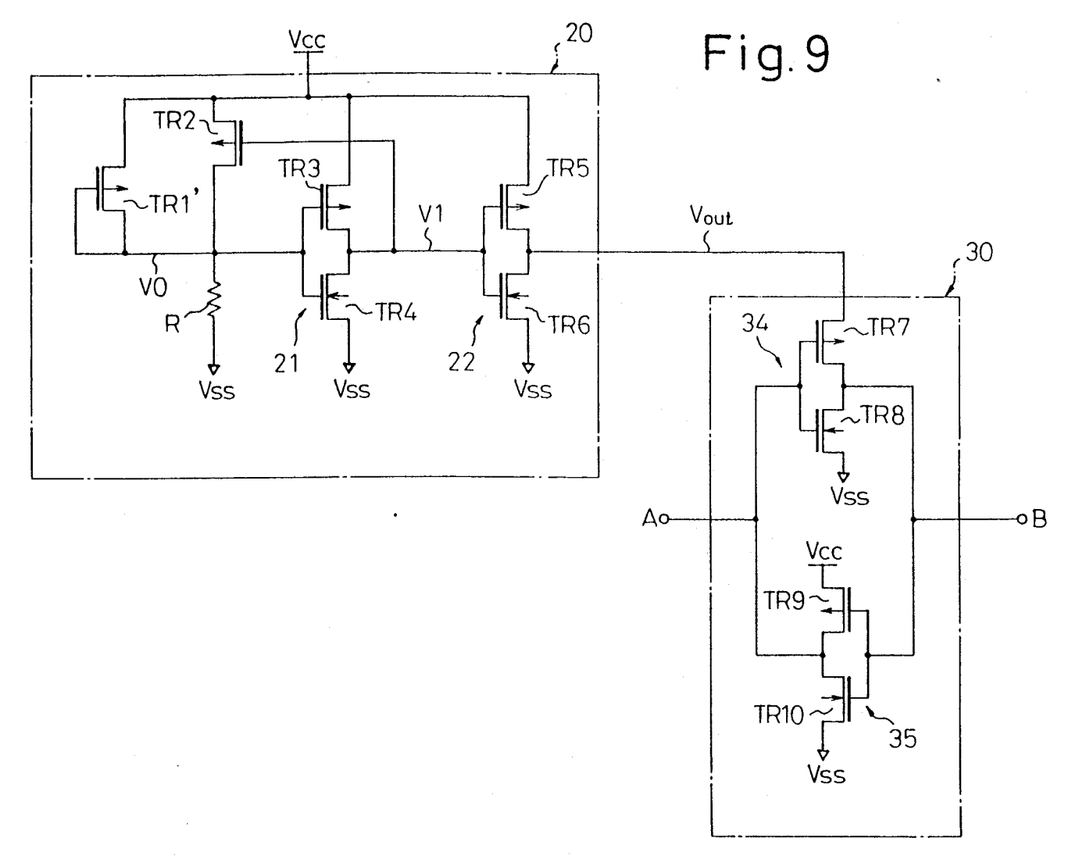
FIG. 9 is a circuit diagram of another embodiment of the initialization setting circuit according to the present invention.

Furthermore, although the foregoing embodiment employs the n channel transistor TR1 as the element for outputting voltage Vo that is lower than the power source voltage Vcc by a given magnitude, it can be replaced with p channel transistor TR1'' as shown in FIG. 9. It is clear that the substantially equivalent effect can be expected. In addition, although the foregoing discussion is given for the application of the shown embodiment of the initialization setting circuit for the self-timed ransom-access-memory, the initialization setting circuit according to the present invention is not limited to the specific application. For example, it is equally applicable for semiconductor devices which have latch circuits at the input stages.

We claim:

1. An initialization setting circuit for setting an initial state of a latch circuit in a semiconductor device upon ON-set of power supply, comprising:
    a detecting circuit active in response to ON-set of power supply for detecting power source voltage reaching a predetermined level; and
    an output level controlling circuit responsive to a detecting signal output from said detecting circuit for elevating an output signal of the initialization setting circuit to a high potential level, or to pull down the output signal to a low potential level,
    the output signal controlled by said output level controlling circuit being supplied to said latch circuit as the power source voltage.

2. An initialization setting circuit as set forth in claim 1, wherein said detecting circuit is active in response to ON-set of the power supply and includes a semiconductor element that outputs a voltage that has a level lower than said power source voltage by a predetermined threshold level, an inverter receiving said power source voltage and responsive to an output voltage of said semiconductor element, and a voltage holding circuit for maintaining a level relationship of the output voltage of said semiconductor element relative to the threshold level of said inverter after ON-set of the power supply.

3. An initialization circuit as set forth in claim 2, wherein said output level controlling circuit comprises a first CMOS inverter including a p channel transistor and a n channel transistor connected between a power source line of high potential and a power source line of low potential.

4. An initialization setting circuit as set forth in claim 3, wherein the inverter responsive to the output voltage of said semiconductor element comprises a second CMOS inverter including a p channel transistor and a n channel transistor connected between the high potential power source line (Vcc) and the low potential power source line.

5. An initialization setting circuit as set forth in claim 4, wherein said semiconductor element is an enhancement type n channel transistor and the gate of the transistor is connected to the drain thereof.

6. An initialization setting circuit as set forth in claim 4, wherein said semiconductor device is a p channel transistor, and the gate of the transistor is connected to the drain thereof.

7. An initialization setting circuit as set forth in claim 5, wherein the threshold level of said enhancement type n channel transistor is set higher than the threshold level of the p channel transistor of said second CMOS inventer.

8. An initialization setting circuit as set forth in claim 7, wherein said voltage holding circuit comprises a p channel transistor connected between said high potential power source line and the input terminal of said second CMOS inverter and a resistor connected between said input terminal of said second CMOS inverter and said low potential power source line; said p channel transistor being responsive to the output voltage level of said second CMOS inverter to be turned ON and OFF to maintain the input voltage level of said second CMOS inverter.

9. A semiconductor memory device comprising:
    a memory cell array;
    a circuit for generating a clock signal for synchronization of operations of respective internal circuits;
    register means receiving an external address signal, data and control signal in response to said clock signal, and including latch means for maintaining the received state and an initialization setting means for setting the initial state of said latch means upon ON-set of power supply;
    peripheral circuit for controlling access of memory and reading and writing of data out and in said memory cell array on the basis of said address signal, data and control signal input through said register;
    said initialization setting means comprising:
    a detecting circuit active in response to ON-set of power supply for detecting a power source voltage reaching a predetermined level; and
    an output level controlling circuit responsive to a detecting signal output from said detecting circuit for elevating an output signal of the initialization setting circuit to a high potential level, or to lowering the output signal to a low potential level,
    the output signal controlled by said output level controlling circuit being supplied to said latch circuit as the power source voltage.

10. A semiconductor memory device as set forth in claim 9, wherein said detecting circuit is active in response to ON-set of power supply and includes a semiconductor element that outputs a voltage that has a level lower than said power source voltage by a predetermined threshold level, an inverter receiving said power source voltage and responsive to an output voltage of said semiconductor element, and a voltage holding circuit for maintaining a level relationship of the output voltage of said semiconductor element relative to the threshold level of said inverter after ON-set of the power supply.

11. A semiconductor memory device as set forth in claim 10, wherein said register means includes a plurality of registers respectively provided corresponding to said external address signal, data and control signal, each of a plurality of said registers has said latch means, and at least one of a plurality of said registers includes said initialization setting circuit.

* * * * *

UNITED STATES PATENT AND TRADEMARK OFFICE
CERTIFICATE OF CORRECTION

PATENT NO. : 5,307,319            Page 1 of 2
DATED : April 26, 1994
INVENTOR(S) : Kohketsu et al It is certified that error appears in the above-indentified patent and that said Letters Patent is hereby corrected as shown below:

Column 2, lines 8-9, delete "inventer" and insert --inverter--;

Column 2, line 50, delete "be";

Column 4, line 52, delete "(D0OT)" and insert --(DOUT)--;

Column 4, line 66, delete "inventer" and insert --inverter--;

Column 5, lines 1-2, delete "inventer" and insert --inverter--;

Column 5, line 30, delete "4" and insert --54--;

Column 5, line 31, delete "6" and insert --56--;

Column 5, line 37, delete "7" and insert --57--;

UNITED STATES PATENT AND TRADEMARK OFFICE
CERTIFICATE OF CORRECTION

PATENT NO. : 5,307,319
DATED : April 26, 1994
INVENTOR(S) : Kohketsu et al.

It is certified that error appears in the above-indentified patent and that said Letters Patent is hereby corrected as shown below:

Column 5, line 48, delete "inventer" and insert --inverter--;

Column 6, line 34, delete "inventer" and insert --inverter--;

Column 7, line 7, delete "inventer" and insert --inverter 22--;

Column 7, line 27, delete "TR" and insert --TR1'-- and

Column 7, line 32, delete "ransom" and insert --random--.

Column 7, line 47, after "signal", insert --(Vout)--; and

Column 8, line 22, delete "inventer" and insert --inverter--.

Signed and Sealed this

Sixth Day of December, 1994

Attest:

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 5,307,319
DATED : April 26, 1994
INVENTOR(S) : Kohketsu et al.

It is certified that error appears in the above-indentified patent and that said Letters Patent is hereby corrected as shown below:

On the title page, item [73]:

After "Fujitsu Limited, Japan" insert --; Fujitsu VLSI Limited, Japan--.

Signed and Sealed this

Twenty-first Day of March, 1995

Attest:

BRUCE LEHMAN

Attesting Officer      Commissioner of Patents and Trademarks